(12) United States Patent
Ignjatovic et al.

(10) Patent No.: US 12,738,903 B2
(45) Date of Patent: Sep. 15, 2026

(54) VOLTAGE-TO-TIME-TO-VOLTAGE AMPLIFIER (VTVA) USING TIME DELAY

(71) Applicant: QUALCOMM Incorporated, San Diego, CA (US)

(72) Inventors: Zeljko Ignjatovic, Rochester, NY (US); Behnam Sedighi, La Jolla, CA (US)

(73) Assignee: Qualcomm Incorporated, San Diego, CA (US)

( * ) Notice: Subject to any disclaimer, the term of this patent is extended or adjusted under 35 U.S.C. 154(b) by 447 days.

(21) Appl. No.: 18/467,313

(22) Filed: Sep. 14, 2023

(65) Prior Publication Data

US 2025/0096750 A1 Mar. 20, 2025

(51) Int. Cl.
*H03F 3/45* (2006.01)
*H03F 3/217* (2006.01)

(52) U.S. Cl.
CPC .................................... *H03F 3/217* (2013.01)

(58) Field of Classification Search
CPC ..................................... H03F 3/45; H03F 1/12
USPC .................................................... 330/252, 51
See application file for complete search history.

(56) References Cited

U.S. PATENT DOCUMENTS 6,968,167 B1 * 11/2005 Wu .................... H03H 21/0012 455/313
8,400,545 B2 * 3/2013 Tejada .................. H04N 25/78 348/308
9,413,373 B1 8/2016 Ishii et al.
2003/0202365 A1 * 10/2003 Daun-Lindberg .... H02M 3/285 363/24
2013/0257637 A1 * 10/2013 Gotoh ..................... H03M 1/66 330/252
2013/0285767 A1 * 10/2013 Visconti ............... H03H 11/126 333/173
2014/0132438 A1 5/2014 Shen et al.
2019/0326918 A1 10/2019 Kinyua
2023/0012330 A1 1/2023 Michel
2023/0387929 A1 * 11/2023 Sedighi ............... H03M 1/0854

OTHER PUBLICATIONS

International Search Report and Written Opinion—PCT/US2024/046229—ISA/EPO—Jan. 9, 2025.

(Continued)

*Primary Examiner* — Henry Choe
(74) *Attorney, Agent, or Firm* — Gerald P. Joyce, III

(57) ABSTRACT

Certain aspects of the present disclosure generally relate to a voltage-to-time-to-voltage amplifier (VTVA). The VTVA may include: a first input capacitive element selectively coupled to a first input node of the VTVA; a first amplifier having an input coupled to the first input capacitive element; a first current source configured to sink a first discharge current from the first input capacitive element during a first phase through a first switch; and a first output capacitive element coupled to a first output node of the VTVA. In some aspects, the first current source is further configured to sink a second discharge current from the first output capacitive element during a second phase through a second switch, the second switch comprising a control input coupled to an output of the first amplifier; and the first phase is non-overlapping with the second phase.

24 Claims, 9 Drawing Sheets

(56) References Cited

OTHER PUBLICATIONS

Yamamoto K., et al., "A 1-1-1-1 MASH Delta-Sigma Modulator With Dynamic Comparator-Based OTAs", IEEE Journal of Solid-state Circuits, IEEE, USA, vol. 47, No. 8, Aug. 1, 2012, pp. 1866-1883, XP011453859, Section I, figure 1.
Zamani M., et al., "A10-bit, 20-MS/s, Fully Differential Single Transfer Phase CBSC Pipelined ADC in 0.18μm CMOS", Electronic Devices, Systems and Applications (ICEDSA), 2011 International Conference on, IEEE, Apr. 25, 2011, pp. 77-82, XP031902994, Section I, figures 1,2.
Chen C-C., et al., "A 12-ENOB Second-Order Noise-Shaping SAR ADC With PVT-Insensitive Voltage- Time-Voltage Converter", IEEE Journal of Solid-State Circuits, 2023, pp. 1-10.

* cited by examiner

VOLTAGE-TO-TIME-TO-VOLTAGE AMPLIFIER (VTVA) USING TIME DELAY

TECHNICAL FIELD

Certain aspects of the present disclosure generally relate to electronic circuits and, more particularly, to a voltage-to-time-to-voltage amplifier.

BACKGROUND

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include transmitters for processing signals for transmission and a receiver for processing received signals. The receiver may include an analog-to-digital converter (ADC) for converting a received signal from an analog domain to a digital domain, allowing for signal processing using a digital signal processor (DSP).

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure generally relate to a voltage-to-time-to-voltage amplifier (VTVA). The VTVA may include: a first input capacitive element selectively coupled to a first input node of the VTVA; a first amplifier having an input coupled to the first input capacitive element; a first current source configured to source or sink a first current to or from the first input capacitive element during a first phase through a first switch; and a first output capacitive element coupled to a first output node of the VTVA. In some aspects, the first current source is further configured to source or sink a second current to or from the first output capacitive element during a second phase through a second switch, the second switch comprising a control input coupled to an output of the first amplifier; and the first phase is non-overlapping with the second phase.

Certain aspects of the present disclosure generally relate to a method for voltage-to-time-to-voltage amplification. The method generally includes: sourcing or sinking, via a first current source, a first current to or from a first input capacitive element during a first phase, the first input capacitive element being selectively coupled to a first input node of a VTVA; comparing, via a first amplifier, a voltage on the first input capacitive element to a threshold voltage; and sourcing or sinking, via the first current source, a second current to or from a first output capacitive element during a second phase based on the comparison, the first output capacitive element being coupled to a first output node of the VTVA, wherein the first phase is non-overlapping with the second phase.

Certain aspects of the present disclosure generally relate to a VTVA. The VTVA may include: a first input capacitive element selectively coupled to a first input node of the VTVA; a first amplifier having an input coupled to the first input capacitive element; a first current source; a first switch coupled between the first current source and the first input capacitive element; a first output capacitive element coupled to a first output node of the VTVA; and a second switch coupled between the first current source and the first output capacitive element, a control input of the second switch being coupled to an output of the first amplifier.

Certain aspects of the present disclosure generally relate to a differential VTVA. The VTVA may include: a first input capacitive element and a second input capacitive element selectively coupled to differential input nodes of the VTVA, respectively; a first amplifier and a second amplifier having inputs coupled to the first input capacitive element and the second input capacitive element, respectively; a first current source selectively coupled to the first input capacitive element via a first switch; a second current source selectively coupled to the second input capacitive element via a second switch; a first alternating-current (AC)-coupling capacitive element coupled between the first switch and the first input capacitive element; and a second AC-coupling capacitive element coupled between the second switch and the second input capacitive element.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
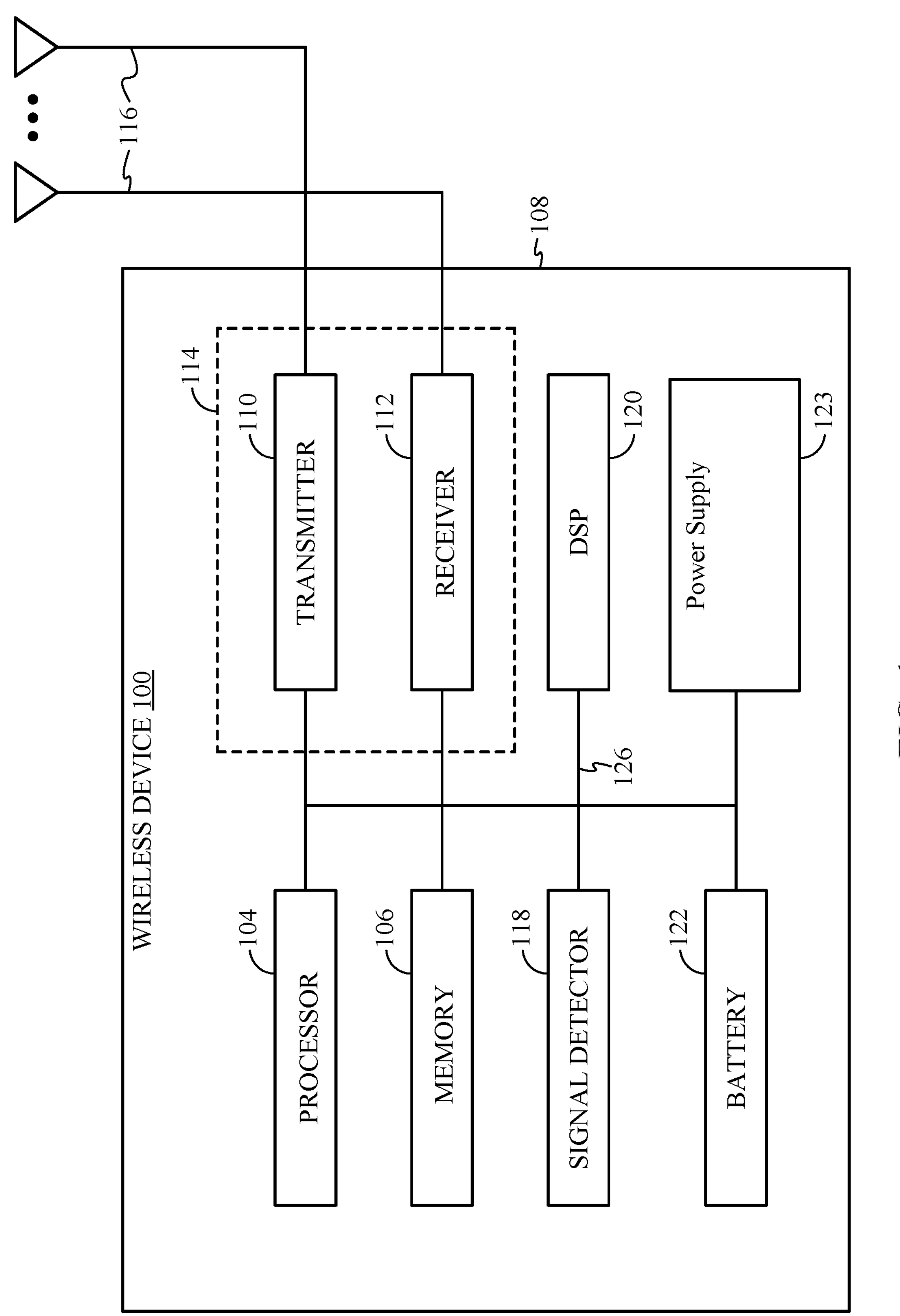
FIG. 1 illustrates a block diagram of an example electronic device, in which aspects of the present disclosure may be practiced.

Certain aspects of the present disclosure provide a voltage-to-time-voltage amplifier (VTVA). The VTVA may be implemented by discharging (or charging) an input capacitive element during a first discharge (or charge) phase and discharging (or charging) an output capacitive element during a second discharge phase, using the same current source. Thus, the first and second phases may be non-overlapping phases, allowing the same current source to be used for both the first and second discharging (or charging) phases. In some aspects, a pulse used to operate the first discharge (or charging) phase may be delayed using a delay element (e.g., a delay line) to implement the second discharging (or charging) phase, the delay being long enough so that the first and second discharging (or charging) phases do not overlap. In some aspects, logic may be used to generate pulses to implement the first and second discharging (or charging) phases, as described in more detail herein. Certain aspects of the present disclosure provide faster amplification time, increased linearity, and reduced sensitivity to process, voltage, and temperature (PVT) and common-mode variations as compared to conventional implementations.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

It should be understood that aspects of the present disclosure may be used in a variety of applications. Although the present disclosure is not limited in this respect, the circuits disclosed herein may be used in any of various suitable apparatuses, such as in the power supply, battery charging circuit, or power management circuit of a communication system, a video codec, audio equipment such as music players and microphones, a television, camera equipment, and test equipment such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCS), personal digital assistants (PDAs), and the like.

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, an Internet of things (IoT) device, a wearable device, a virtual reality (VR) or augmented reality (AR) device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically coupled to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

In some aspects of the present disclosure, the device 100 may include a voltage-to-time-voltage amplifier (VTVA). The VTVA may be used to implement a pipelined analog-to-digital converter (ADC), in some implementations. As one example, the ADC may be used for conversion of receive signals from an analog domain to a digital domain for digital signal processing (e.g., via DSP 120). While a pipelined ADC is provided as one example use case for the VTVA described herein, the VTVA may be used for any suitable application.

The device 100 may further include a battery 122, which may be used to power the various components of the device 100 (e.g., when the device is disconnected from an external power source). The device 100 may also include a power supply system 123 for managing the power from the battery (or from one or more power ports for receiving external power) to the various components of the device 100.

The various components of the device 100 may be coupled together by a bus system 126, which may include a power bus, a control signal bus, and/or a status signal bus in addition to a data bus. Additionally or alternatively, various combinations of the components of the device 100 may be coupled together by one or more other suitable techniques.

Example Voltage-to-Time-to-Voltage Amplifier (VTVA)

Certain aspects are directed towards a voltage-to-time-to-voltage amplifier (VTVA). The VTVA may be used as a residue amplifier in pipelined analog-to-digital converters (ADCs) to achieve improved linearity and conversion speed. However, the VTVA may be used for any other suitable application, such as applications that may benefit from high speed, high linearity, and/or gain insensitivity to process, voltage, and temperature (PVT) variations.

Typical residue amplifiers may exhibit performance issues such as non-linearity, reduced speed, noise, and sensitivity to PVT variations with unfavorable trade-offs reducing the overall conversion speed, linearity, and/or accuracy of pipelined ADCs (e.g., successive approximation register (SAR) ADCs). State-of-the-art residue amplifiers present a bottleneck for further performance enhancement of pipelined ADCs. Certain aspects provide an improved amplifier design (e.g., faster, more linear, and a scalable design) that enables enhanced performance ADCs (e.g., such as improved conversion speed and accuracy) in advanced process nodes.

Certain aspects are directed towards a VTVA operating with multiple operating phases. During a first phase, the VTVA converts an input voltage signal ($V_{in}$) to a time-domain pulse with a width (e.g., duration) of $T_p$ in accordance with a first transfer function. The transfer function ($H_{T/V}$) may be:

$$H_{T/V} = T_p/V_{in}$$

During a second phase, the VTVA may delay the time-domain pulse from the first phase, resulting in a delayed time-domain pulse having a duration $T_{pd}$. During a third phase, the VTVA converts the delayed time-domain pulse to an output voltage ($V_{out}$) in accordance with a second transfer function ($K_{V/T}$), the second transfer function being:

$$K_{V/T} = V_{out}/T_{pd}$$

The delay used to provide the delayed time-domain pulse (e.g., having a duration $T_{pd}$) may be sufficiently long so that the delayed time-domain pulse is non-overlapping with the time-domain pulse and that at least a portion of the VTVA can be used for both conversions per transfer functions $H_{T/V}$ and $K_{V/T}$ during the first and third phases. The resulting overall voltage gain may be equal or close to:

$$\frac{K_{V/T}}{H_{T/V}}.$$

Figure 2:
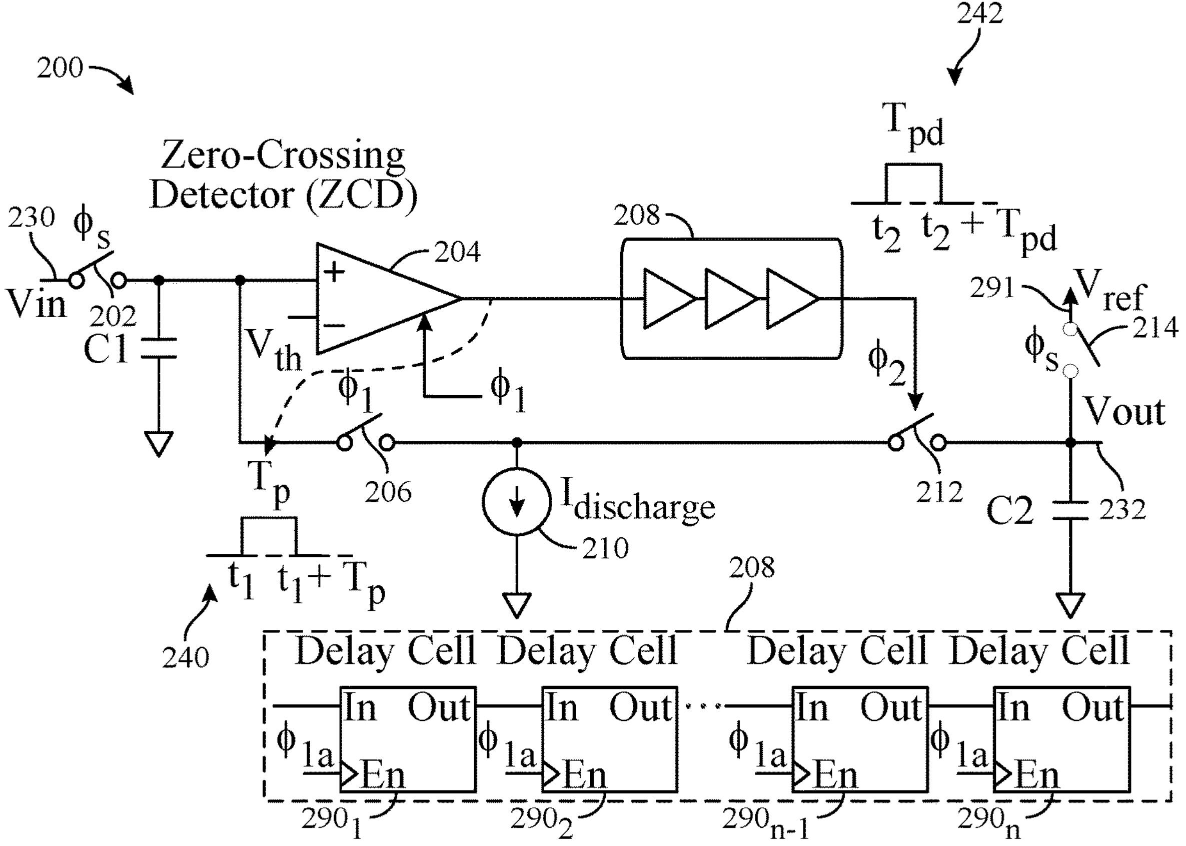
FIG. 2 illustrates a single-ended voltage-to-time-voltage amplifier (VTVA), in accordance with certain aspects of the present disclosure.

FIG. 2 illustrates a single-ended VTVA 200, in accordance with certain aspects of the present disclosure. As shown, the VTVA 200 includes an input capacitive element C1. A first terminal of capacitive element C1 may be coupled to a positive input terminal of amplifier 204, and a second terminal of capacitive element C1 may be coupled to a reference potential node (e.g., electric ground). During a sampling phase ($\phi_s$), an input signal Vin at an input node 230 may be sampled onto the capacitive element C1 by closing switch 202 while an output voltage (Vout) at the output node 232 is being set to a reference voltage ($V_{ref}$) by closing switch 214 and coupling the output node 232 to a $V_{ref}$ node 291. For example, an output capacitive element C2 may be coupled to the $V_{ref}$ node, charging the capacitive element C2 to $V_{ref}$. A first terminal of capacitive element C2 may be coupled to switches 212, 214, and a second terminal of capacitive element C2 may be coupled to a reference potential node (e.g., electric ground). After the sampling phase, a first conversion phase $\phi_1$ may begin. The first phase may have a constant duration in some implementations. As shown, a positive input of an amplifier 204 (e.g., a comparator or a zero-crossing detector (ZCD)) may be coupled to the capacitive element C1, and a negative input of the amplifier 204 may receive a threshold voltage ($V_{th}$). A signal representing phase $\phi_1$ (e.g., a signal that is logic high during phase $\phi_1$) may be provided to the amplifier 204, enabling the amplifier 204 to begin comparing the voltage on capacitive element C1 to $V_{th}$. Thus, at the beginning of phase $\phi_1$, the output signal of amplifier 204 transitions to logic high (e.g., causing a rising edge of pulse 240 at the output of amplifier 204 at a time $t_1$). During phase 41, a switch 206 is closed, and a current source 210 may sink a discharge current ($I_{discharge}$, also referred to herein as "$I_{DIS}$") to discharge the capacitive element C1 at a constant rate. Thus, the voltage at the positive input of amplifier 204 may decrease at a constant rate until the voltage reaches the $V_{th}$. When the voltage across capacitive element C1 reaches $V_{th}$ as detected by the amplifier 204, the falling edge (e.g., at time $t_1$ plus $T_p$, of the pulse 240 is created at the output of amplifier 204, such that:

$$T_p = \frac{C_1(V_{in} - V_{th})}{I_{discharge}} + T_{zcd}$$

where $T_p$ is the duration of a time-domain pulse 240 at the output of amplifier 204, $C_1$ is the capacitance of capacitive element C1, $T_{zcd}$ is a constant delay associated with the amplifier 204. The time-domain pulse at the output of the amplifier 204 propagates through a delay element (e.g., a delay line 208), generating a delayed time-domain pulse 242 at the output of the delay line 208. In some aspects, the delay line 208 may be implemented with a number of delay cells 290$_1$ to 290$_n$ (collectively referred to as delay cells 290). The delay cells may be chained together, with the output of one delay cell coupled to an input of the next delay cell, as shown. Each of the delay cells may include an enable input (labeled "En"). The enable inputs may receive an enable signal during an enable phase ($\phi_{1a}$), as described in more detail herein. The pulse 242 may have a duration ($T_{pd}$) which may be the same as $T_p$. When the VTVA is used to implement a residual amplifier for a SAR ADC, the duration $T_p$ (and duration $T_{pd}$) may be referred to as residual time ($t_{res}$) because the durations $T_p$ and $T_{pd}$ may correspond to a residual voltage being amplified for the SAR ADC. The rising edge of the delayed time-domain pulse 242 engages a second conversion phase ($\phi_2$). During phase $\phi_2$, switch 212 is closed, and the discharge current ($I_{discharge}$) sunk by current source 210 discharges the capacitive element C2 coupled to the output node 232.

Since the input capacitive element C1 and the output capacitive element C2 are discharged using the same current source 210, Vout may be equal to $$V_{ref} - \frac{C_1}{C_2}(V_{in} - V_{th}) + V_{off}$$

where $V_{off}$ is a voltage offset due to the delay $T_{zcd}$. $V_{off}$ may impact the common mode of a differential output voltage in a pseudo-differential topology, as described in more detail herein.

Certain aspects provide the pulse 240 through an inherent delay of the amplifier 204 and subsequent delay line 208 so that pulses 240, 242 do not overlap, allowing the same current source to be used in both discharging phases for capacitive elements C1 and C2, reducing circuit mismatch, reducing gain error, and increasing linearity. Along with a fast amplification time (e.g., a few 100's of ps), the VTVA may offer increased linearity and insensitivity to PVT and common-mode variations compared to state-of-the-art open-loop amplifiers.

Figure 3:
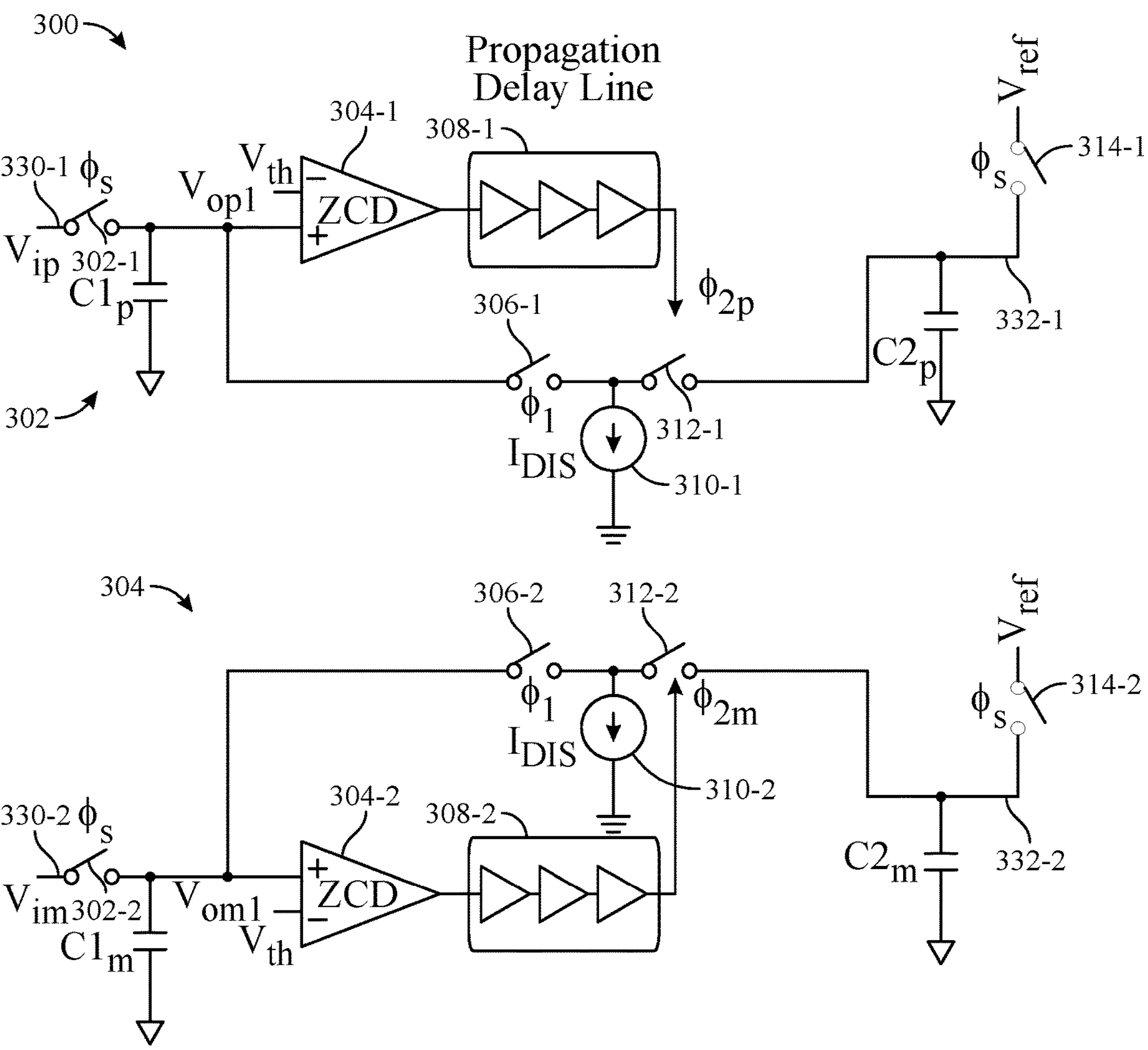
FIG. 3 illustrates a differential VTVA, in accordance with certain aspects of the present disclosure.

FIG. 3 illustrates a differential VTVA 300, in accordance with certain aspects of the present disclosure. As shown, the VTVA 300 may be implemented using two single-ended VTVAs, each having a configuration corresponding to the VTVA 200 described with respect to FIG. 2. For example, the VTVA 300 may include a positive VTVA circuit 302 and a negative VTVA circuit 304. The operations of the VTVA circuit 302 and the VTVA circuit 304 may be similar to that described with respect to FIG. 2. For the VTVA 300, the positive VTVA circuit 302 may not share any common components with the negative VTVA circuit 304.

The VTVA circuit 302 may include a switch 302-1 (e.g., corresponding to switch 202 of FIG. 2) coupled between a positive input node 330-1 (e.g., corresponding to input node 230 of FIG. 2) and a capacitive element $C1_p$ (e.g., corresponding to capacitive element C1 of FIG. 2), as shown. A first terminal of the capacitive element $C1_p$ may be coupled to a positive input of an amplifier 304-1 (e.g., corresponding to amplifier 204 of FIG. 2) and to a current source 310-1 (e.g., corresponding to current source 210) through a switch 306-1 (e.g., corresponding to switch 206). A second terminal of the capacitive element $C1_p$ may be coupled to a reference potential node (e.g., electric ground). As described, during a sampling $\phi_s$, the capacitive element $C1_p$ may sample a positive input voltage ($V_{ip}$) at the input node 330-1 and the capacitive element $C2_p$ may sample a reference voltage ($V_{ref}$). As shown, a first terminal of the capacitive element $C_{2p}$ may be coupled to switches 312-1, 314-1, and a second terminal of the capacitive element $C_{2p}$ may be coupled to a reference potential node (e.g., electric ground). During a first phase $\phi_1$, switch 306-1 may be closed so that the discharge current ($I_{DIS}$) sunk by current source 310-1 discharges the capacitive element $C1_p$. Once the voltage across capacitive element $C1_p$ reaches $V_{th}$ provided to the negative input of amplifier 304-1, the output signal of the amplifier 304-1 transitions from logic high to logic low. The pulse at the output of the amplifier 304-1 is provided to a delay line 308-1 (e.g., corresponding to delay line 208) to generate a pulse to control switch 312-1 (e.g., corresponding to switch 212). Switch 312-1 is closed during a second phase ($\phi_{2p}$) for the positive VTVA circuit 302, during which the capacitive element $C_{2p}$ is discharged to generate a positive differential output voltage at output node 332-1.

Similarly, the VTVA circuit 304 may include a switch 302-2 (e.g., corresponding to switch 202 of FIG. 2) coupled between a negative input node 330-2 (e.g., corresponding to input node 230 of FIG. 2) and a capacitive element $C1_m$(e.g., corresponding to capacitive element C1 of FIG. 2), as shown. A first terminal of the capacitive element $C1_m$ may be coupled to a positive input of an amplifier 304-2 (e.g., corresponding to amplifier 204 of FIG. 2) and to a current source 310-2 (e.g., corresponding to current source 210) through a switch 306-2 (e.g., corresponding to switch 206). A second terminal of the capacitive element $C1_m$ may be coupled to a reference potential node (e.g., electric ground). As described, during a sampling $\phi_s$, the capacitive element $C1_m$ may sample a negative input voltage ($V_{im}$) at the input node 330-2 and the capacitive element $C2_m$ may sample $V_{ref}$. $V_{ip}$ and $V_{im}$ form a differential input voltage for the VTVA 300. As shown, a first terminal of the capacitive element $C_{2m}$ may be coupled to switches 312-2, 314-2, and a second terminal of the capacitive element $C_{2m}$ may be coupled to a reference potential node (e.g., electric ground). During the first phase $\phi_1$, switch 306-2 may be closed so that the discharge current ($I_{DIS}$) sunk by current source 310-2 discharges the capacitive element $C1_m$. Once the voltage across capacitive element $C1_m$ reaches $V_{th}$ provided to the negative input of amplifier 304-2, the output signal of the amplifier 304-2 transitions from logic high to logic low. The pulse at the output of the amplifier 304-2 is provided to a delay line 308-2 (e.g., corresponding to delay line 208) to generate a pulse to control switch 312-2 (e.g., corresponding to switch 212). Switch 312-2 is closed during a second phase ($\phi_{2m}$) for the negative VTVA circuit 304, during which the capacitive element $C2_m$ is discharged to generate a negative differential output voltage at output node 332-2.

In some aspects, The VTVA 300 may be used to implement a residue amplifier for a pipelined successive approximation (SAR) analog-to-digital converter (ADC). The SAR ADC may be implemented using capacitor digital-to-analog converters (CDACs). For example, in some implementations, each of the capacitive elements $C1_p$, $C2_p$, $C1_m$, and $C2_m$ may be a CDAC.

Figure 4:
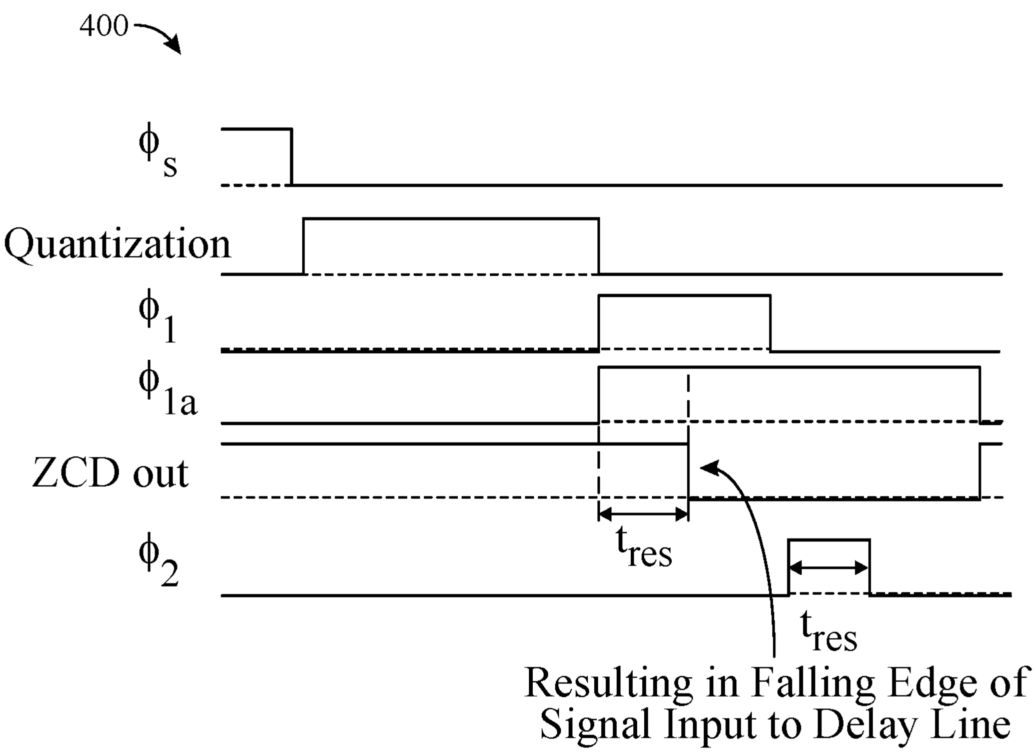
FIG. 4 is a timing diagram illustrating example operations of a VTVA, in accordance with certain aspects of the present disclosure.

FIG. 4 is a timing diagram 400 illustrating example operations of the VTVA 300, in accordance with certain aspects of the present disclosure. As shown, during a sampling phase $\phi_s$, the input voltages ($V_{ip}$ and $V_{im}$) are sampled, as described herein. After the sampling phase, a quantization phase may begin. For example, a SAR ADC may perform quantization using the CDACs (e.g., represented by $C1_p$ and $C1_m$), and a residual voltage after the quantization may remain on each of the capacitive elements $C1_p$ and $C1_m$ (e.g., labeled "$V_{op1}$" and "$V_{om1}$" in FIG. 3). The residual voltages $V_{op1}$ and $V_{om1}$ (e.g., a differential voltage) are then amplified by the VTVA, as described herein. For instance, a first phase $\phi_1$ (e.g., having fixed duration) may begin, discharging capacitive elements $C1_p$ and $C1_m$. As shown, a phase $\phi_{1a}$ may also begin, during which the delay lines 308-1, 308-2 are enabled. Once the voltages on capacitive elements $C1_p$ (or $C1_m$) reach $V_{th}$, the output signal (labeled "ZCD out") of the associated amplifier 304-1 (or 304-2) transitions to logic low, as shown. The delay from the beginning of phase $\phi_1$ to the time at which ZCD out transitions to logic low may correspond to the residual voltage (e.g., corresponding to a duration which may be referred to herein as "$t_{res}$"). After a delay associated with the ZCD and the delay line, the second phase $\phi_2$ begins during which capacitive elements $C2_p$ and $C2_m$ are discharged. The delay may be long enough so that phase $\phi_1$ and phase $\phi_2$ do not overlap, as described herein. The duration of phase $\phi_2$ may be the same as the duration (e.g., $t_{res}$) of phase $\phi_1$. Once phase $\phi_1$ is complete, capacitive elements $C1_p$ and $C1_m$ may be used to sample respective input voltages again concurrently with phase $\phi_2$.

Figure 5:
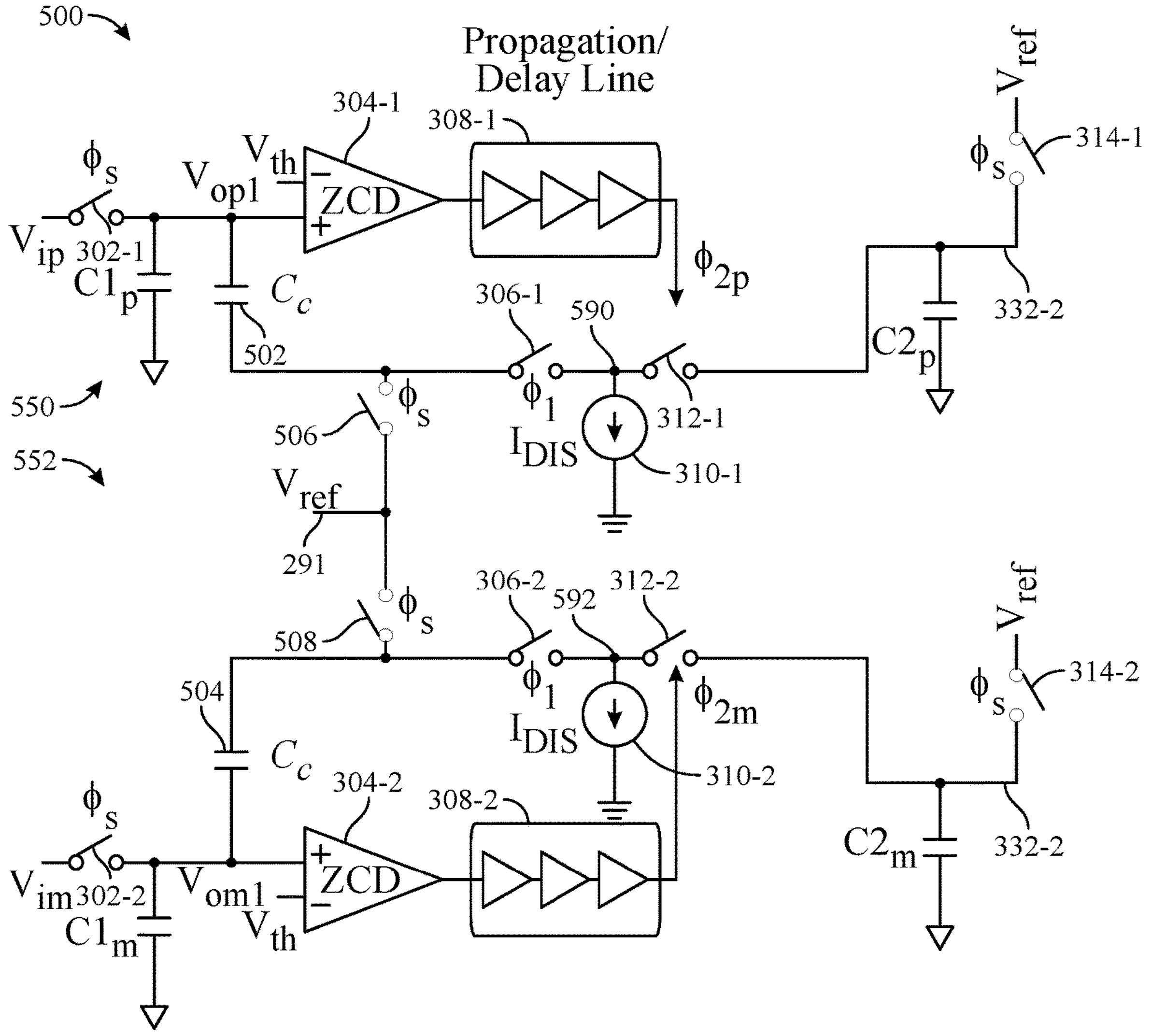
FIGS. 5 and 6 illustrate VTVAs implemented with alternating-current (AC) coupling capacitive elements (Cc), in accordance with certain aspects of the present disclosure.
Figure 6:
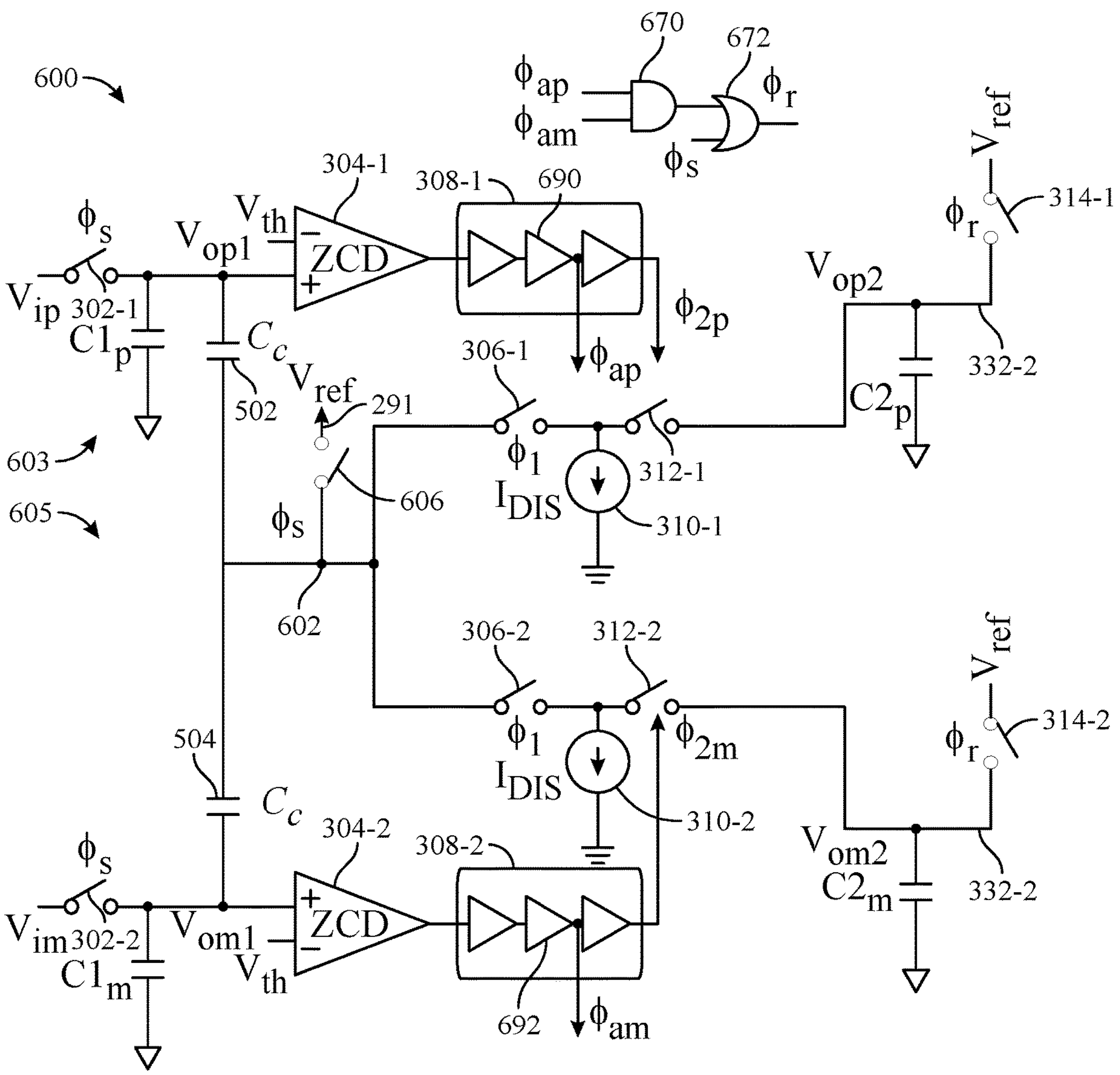

FIGS. 5 and 6 illustrate a VTVA 500 and a VTVA 600, respectively, implemented with alternating-current (AC) coupling capacitive elements (Cc), in accordance with certain aspects of the present disclosure. The differential VTVA 500 and VTVA 600 may be faster and with increased gain stability as compared to some conventional amplifiers.

In some aspects, of the present disclosure, an alternating-current (AC)-coupling capacitive element 502 is coupled between switch 306-1 and the capacitive element $C1_p$ and an AC-coupling capacitive element 504 is coupled between switch 306-2 and capacitive element $C1_m$, as shown. During the sampling phase $\phi_s$, the capacitive element 502 is coupled to the $V_{ref}$ node 291 by closing switch 506 and the capacitive element 504 is coupled to the $V_{ref}$ node 291 by closing switch 508. During the first phase $\phi_1$, the VTVA 500 discharges $C1_p$ through the capacitive element 502 and discharges $C1_m$ through the capacitive element 504. Thus, at the beginning of phase $\phi_1$ and at the beginning of phase $\phi_{2p}$, the voltages at nodes 590, 592 (e.g., across current source 310-1 and across current source 310-2) may be about the same (e.g., is $V_{ref}$). Since the current sources 310-2, 310-2 experience the same voltage in both phases $\phi_1$ and $\phi_{2p}$ ($\phi_{2m}$), the impact of their voltage dependency (e.g., due to finite output resistance) may be diminished, resulting in the accuracy of the amplifier to be improved.

Moreover, the capacitances of each of capacitive element 502 (capacitive element 504) may be selected so that the current source 310-1 (current source 310-2) exhibits the same transients of drain-to-source voltage (Vds) (e.g., associated with transistor implementing the current source 310-1 or 310-2) during both phase $\phi_1$ and phase $\phi_{2p}$ (or $\phi_{2m}$) increasing linearity and gain stability over PVT variations and mismatch. For example, the capacitance of capacitive elements 502 may be selected per expression:

$$C2_p(A_v/(A_v-1))$$

and the capacitance of capacitive elements 504 may be selected per expression:

$$C2_m(A_v/(A_v-1))$$

where $A_v$ is the gain of the VTVA 500, as described herein. The gain $A_v$ of the VTVA 500 for the positive VTVA circuit 550 may be equal to:

$$\frac{C1_p}{C2_p}$$

or gain $A_v$ of the VTVA 500 for the negative VTVA circuit 552 may be equal to:

$$\frac{C1_m}{C2_m}$$

The gain of the VTVA is a function of the ratio of the capacitive elements (e.g., ratio of $C1_p$ and $C2_p$, or $C1_m$ and $C2_m$). The effect of the delay caused by the ZCD impacts both the positive and negative voltage outputs, and thus, is canceled out and may not impact the gain of the VTVA.

As shown in FIG. 6, the capacitive elements 502, 504 may be coupled to a common node 602. As shown, the capacitive elements 502, 504 may be selectively coupled to the current sources 310-1, 310-2 via respective switches 306-1, 306-2. The common node 602 may be selectively coupled to the Vref node 291 via switch 606. The VTVA 600 exhibits lower noise than the VTVA 300 or VTVA 500, while preserving the linearity and speed associated with VTVA 300 and VTVA 500. The noise contribution from the current sources and accompanying switches is lowered for VTVA 600 by connecting both current sources 310-1, 310-2 together (e.g., at common node 602) and capacitively coupling the current sources 310-1, 310-2 to $C1_p$ and $C1_m$, respectively. Thus, noise from the current sources 310-1, 310-2 and switches 306-1, 306-2 in phase (I affects the common mode only and has little to no impact on the differential signal of VTVA 600, reducing IRN from the current sources and switches (e.g., by 3 dB as compared to VTVA 300 or VTVA 500).

Moreover, the noise contribution from the current sources and accompanying switches may be lowered by removing redundant time from duration $T_{pd}$ (e.g., $t_{res}$) of the pulse at the output of the delay line 308-1 (or 308-2). For example, when the differential input signal ($V_{ip}$, $V_{im}$) is small, the delayed time-domain pulse at the output of delay lines 308-1, 308-2 may have the same duration $T_{pd}$ (e.g., $t_{res}$), and thus, the discharge of the capacitive elements $C2_p$, $C2_m$ by respective current sources 310-1, 310-2 may mainly affect the common-mode output voltage component of the VTVA, rather than the differential output voltage component. However, the noise each current source adds is proportional to the total time each current source discharges corresponding capacitive elements $C2_p$, $C2_m$. Therefore, it is beneficial to reduce (or even remove entirely) the duration of delayed time-domain pulses that is common to the positive and negative VTVA circuits 603, 605 of the VTVA 600.

In certain aspects, the output from one or more of the delay cells of each of the delay lines 308-1, 308-2 may be monitored. For example, the output of a delay cell 690 (e.g., corresponding to one of the delay cells 290 described with respect to FIG. 2) may be logic high during a phase $\phi_{ap}$, and the output of a delay cell 692 may be logic high during a phase $\phi_{am}$, as shown. When both output signals from the delay cells 690, 692 are logic high (e.g., are equal to a rail voltage $V_{dd}$), the switches 314-1, 314-2 are closed, resetting the voltage across $C2_p$ and $C2_m$ to $V_{ref}$. For example, the output signals from the delay cells 690, 692 may be provided to inputs of an AND gate, where the output of the AND gate 670 is used to control switches 314-1, 314-2. In some aspects, an OR gate 672 may have an input coupled to an output of AND gate 670, where a second input of the OR gate 672 receives a signal that is logic high during the sampling phase $\phi_s$. The output of the OR gate 672 may be logic high during a reset phase $\phi_r$ and used to close the switches 314-1, 314-2 during the reset phase $\phi_r$. Thus, the switches 314-1, 314-2 are closed during either the sampling phase $\phi_s$ or when the output signals of both the delay cells 690, 692 are logic high. When both outputs from the delay cells 690, 692 are logic high, any noise from the current sources 310-1, 310-2 is directed to the $V_{ref}$ node 291, reducing the effect of the noise on the differential voltage output of the VTVA. Thus, the noise contribution from current sources and associated switches may be reduced by an additional 1-2 dB.

Figure 7:
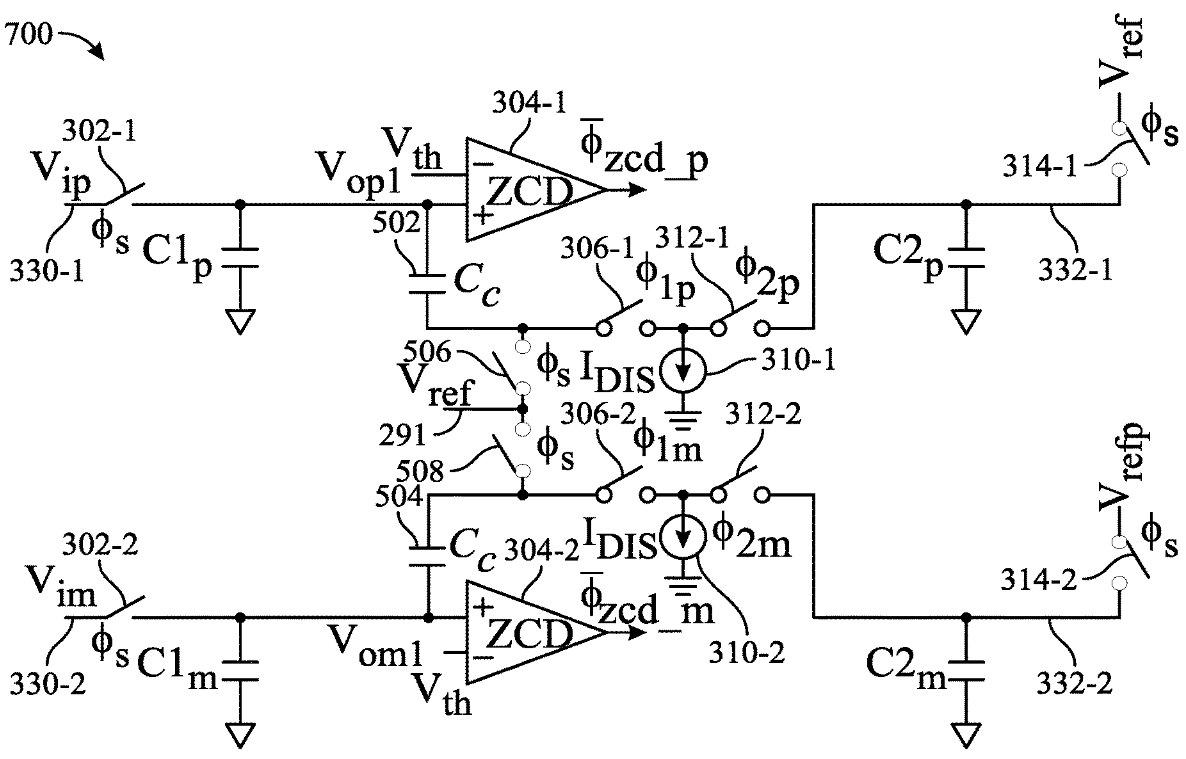
FIG. 7 illustrates a VTVA implemented without delay lines, in accordance with certain aspects of the present disclosure.
Figure 7:
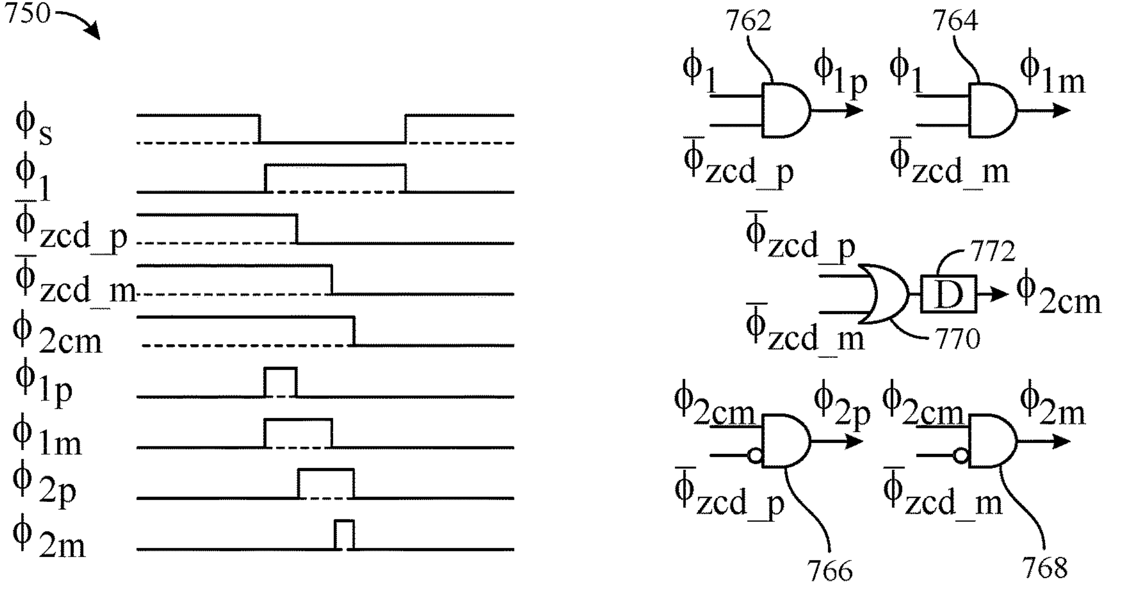

FIG. 7 illustrates a VTVA 700 implemented without delay lines, in accordance with certain aspects of the present disclosure. The VTVA 700 allows time-residue delay and transfer operation without using delay lines, reducing noise and increasing linearity. As shown, the output signals of amplifier 304-1 and amplifier 304-2 may be logic high during phases $\overline{\phi}_{zcd\_p}$ and $\overline{\phi}_{zcd\_m}$. As shown, the output of amplifier 304-1 may be provided to an input of AND gate 762, where a pulse that is logic high during a first phase $\phi_1$ is provided to another input of the AND gate 762. The output of the AND gate 762 is logic high during a phase $\phi_{1p}$. Switch 306-1 is closed during phase $\phi_{1p}$. As shown in timing diagram 750, after the sampling phase $\phi_s$, phase $\phi_1$ begins. When the signals representing phases $\phi_1$ and $\overline{\phi}_{zcd\_p}$ are both logic high, the signal representing phase $\phi_{1p}$ transitions to logic high, closing switch 306-1. The switch 306-1 opens (e.g., ending the discharge phase of capacitive element $C\mathbf{1}_p$) when $\overline{\phi}_{zcd\_p}$ transitions to logic low (e.g., due to the voltage across capacitive element $C\mathbf{1}_p$ reaching $V_{th}$).

Similarly, the output of amplifier 304-2 may be provided to an input of AND gate 764, where a pulse that is logic high during phase $\phi_1$ is provided to another input of the AND gate 764. The output of the AND gate 764 is logic high during a phase $\phi_{im}$. Switch 306-2 is closed during phase $\phi_{im}$. As shown in timing diagram 750, when the signals representing phases $\phi_1$ and $\overline{\phi}_{zcd\_m}$ are both logic high, the signal representing phase $\phi_{1m}$ transitions to logic high, closing switch 306-2. The switch 306-2 opens (e.g., ending the discharge phase of capacitive element $C\mathbf{1}_m$) when $\overline{\phi}_{zcd\_m}$ transitions to logic low (e.g., due to the voltage across capacitive element $C\mathbf{1}_m$ reaching $V_{th}$).

As shown, the signals representing $\overline{\phi}_{zcd\_p}$, $\overline{\phi}_{zcd\_m}$ are provided to inputs of OR gate 770. A delay element 772 may be coupled to an output of the OR gate 770. The output signal of delay element 772 may be logic high during a phase $\phi_{2cm}$. The output signal of OR gate 770 is provided to an input of OR gate 766 and an input of OR gate 768, as shown. Another input of OR gate 766 may receive an inverse of the signal representing $\overline{\phi}_{zcd\_p}$, and another input of OR gate 768 may receive an inverse of the signal representing $\overline{\phi}_{zcd\_m}$. The output of OR gate 766 may be logic high during a phase $\phi_{2p}$ used to control switch 312-1. During phase $\phi_{2p}$, switch 312-1 is closed. Similarly, the output of OR gate 768 may be logic high during a phase $\phi_{2m}$ used to control switch 312-2. Thus, the discharging of capacitive elements $C\mathbf{1}_p$ and $C\mathbf{1}_m$ occurs during phases $\phi_{1p}$ and $\phi_{1m}$, respectively, which may begin at the beginning of phase $\phi_1$ and end after corresponding amplifiers 304-1, 304-2 detect a threshold crossing. Simultaneously with (or with a small delay with respect to) the end of phases $\phi_{1p}$ and $\phi_{im}$, corresponding phases $\phi_{2p}$ and $\phi_{2m}$ are engaged to discharge respective capacitive elements $C\mathbf{2}_p$ and $C\mathbf{2}_m$. Both phases $\phi_{2p}$ and $\phi_{2m}$ end when both amplifiers 304-1, 304-2 detect the threshold crossing (e.g., plus a delay associated with delay element 772), which is indicated by the signal representing phase $\phi_{2cm}$ at the output of delay element 772.

The VTVA described herein provides several advantages over conventional implementations. For example, the VTVA described herein may be used to implement residue amplifiers using the time-residue transfer and delay mechanism described herein, making the residue amplifier less prone to mismatch, gain error, and non-linearity compared to some conventional implementations. In addition, the voltage-to-time-voltage amplification is implemented with noise reduction techniques, which in some cases, may result in close to 6 dB less input-referred noise as compared to some conventional implementations. The VTVA described herein may be used to implement high-speed (e.g., at radio frequency) and high-accuracy ADCs. The VTVA described herein scales well with process nodes and provides faster operation as compared to some conventional implementations (such as switched-capacitor type amplifiers which may not scale well with process nodes and may be slow due to stability issues associated with a feedback loop).

Figure 8:
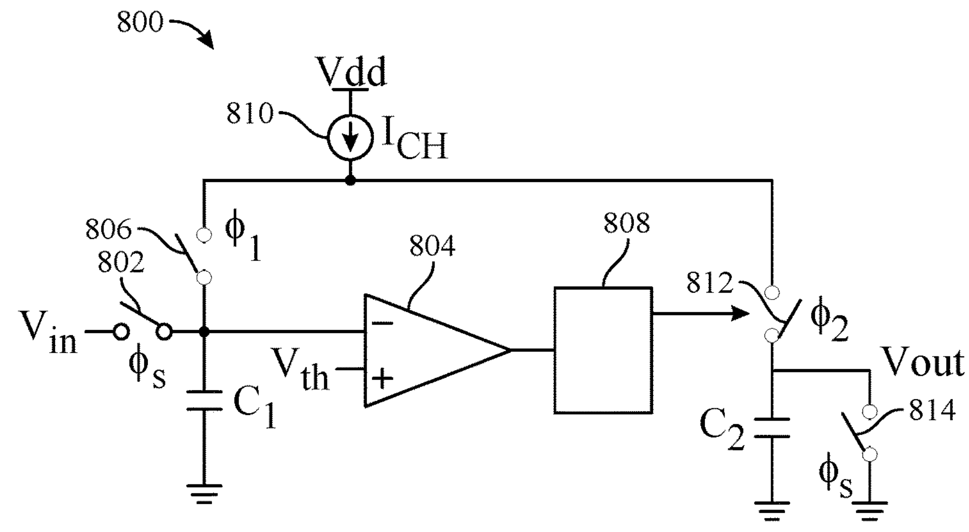
FIG. 8 illustrates a single-ended VTVA using current sourcing, in accordance with certain aspects of the present disclosure
Figure 8:
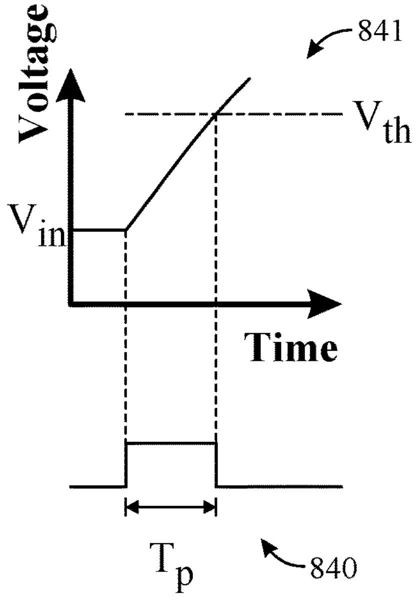
Figure 8:
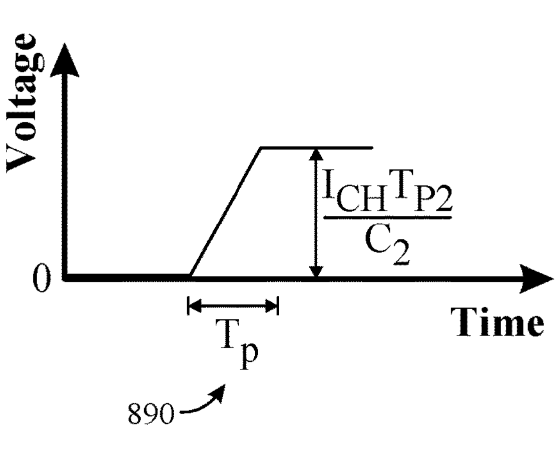

While some example VTVA implementations described herein use current sinking (e.g., discharging capacitive element C1 and C2) to implement a VTVA, the aspects of the present disclosure may be implemented using current sourcing (e.g., charging capacitive elements C1 and C2), as described in more detail with respect to FIG. 8.

FIG. 8 illustrates a single-ended VTVA 800, in accordance with certain aspects of the present disclosure. As shown, the VTVA 800 includes an input capacitive element C1. During a sampling phase ($\phi_s$), an input signal Vin may be sampled onto the capacitive element C1 by closing switch 802 (e.g., corresponding to switch 202) while an output voltage (Vout) is being set to a reference potential (e.g., 0 volts corresponding to electric ground) by closing switch 814 (e.g., corresponding switch 214) and coupling the output node 832 (e.g., corresponding to output node 232) to the reference potential node (e.g., electric ground).

After the sampling phase, a first conversion phase $\phi_1$ may begin. The first phase may have a constant duration in some implementations. As shown, a negative input of an amplifier 804 (e.g., a comparator or a zero-crossing detector (ZCD), which may correspond to amplifier 204) may be coupled to the capacitive element C1, and a positive input of the amplifier 804 may receive a threshold voltage ($V_{th}$). A signal representing phase $\phi_1$ (e.g., a signal that is logic high during phase $\phi_1$) may be provided to the amplifier 804, enabling the amplifier 804 to begin comparing the voltage on capacitive element C1 to $V_{th}$. Thus, at the beginning of phase $\phi_1$, the output signal of amplifier 804 transitions to logic high (e.g., causing a rising edge of pulse 840 at the output of amplifier 804). During phase $\phi_1$, a switch 806 (e.g., corresponding to switch 206) is closed, and a current source 810 (e.g., corresponding to current source 210) may source a charge current $I_{CH}$ to charge the capacitive element C1 at a constant rate, as shown in graph 841. Thus, the voltage at the negative input of amplifier 804 may increase at a constant rate until the voltage reaches $V_{th}$. When the voltage across capacitive element C1 reaches $V_{th}$ as detected by the amplifier 804, the falling edge of the pulse 840 is created at the output of amplifier 804. $T_p$ is the duration of the time-domain pulse 840 at the output of amplifier 804. The time-domain pulse at the output of the amplifier 804 propagates through a delay element (e.g., a delay line 808), generating a delayed time-domain pulse at the output of the delay line 808. In some aspects, the delay line 808 may be implemented with a number of delay cells, as described herein. The delayed time-domain pulse may have a duration ($T_{pd}$) which may be the same as $T_p$. The rising edge of the delayed time-domain pulse engages a second conversion phase ($\phi_2$). During phase $\phi_2$, switch 812 (e.g., corresponding to switch 212) is closed, and the charge current $I_{CH}$ sourced by current source 810 charges the capacitive element C2 coupled to the output node 832, as shown in graph 890. Vout at the end of phase $\phi_2$ may be calculated per expression:

$$V_{ref} + \frac{C_1}{C_2}(V_{in} - V_{th}) + V_{off}$$

The VTVA 800 may be implemented as a differential VTVA in a similar manner as described with FIGS. 3, 5, 6, and 7. Vref may be a negative reference voltage or zero volts (e.g., at ground potential).

Figure 9:
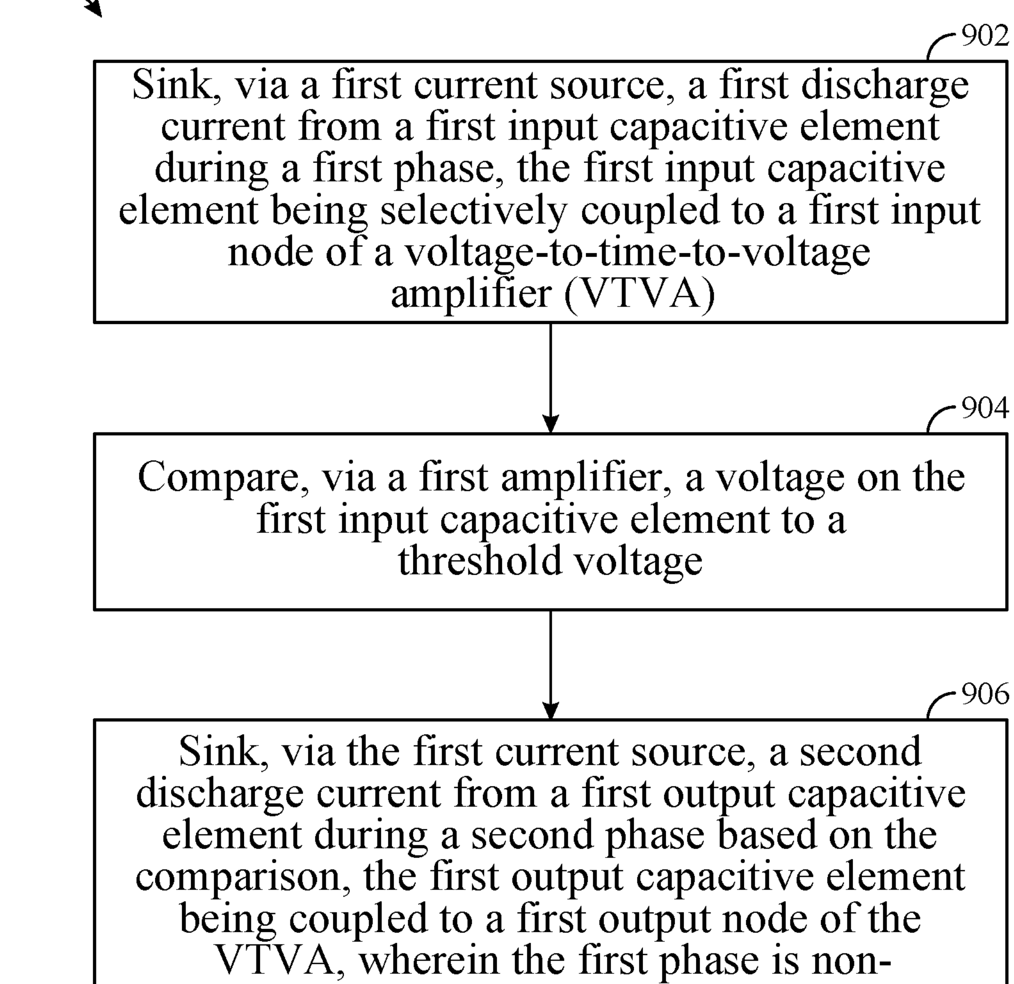
FIG. 9 is a flow diagram illustrating example operations for voltage-to-time-to-voltage amplification.

FIG. 9 is a flow diagram illustrating example operations 900 for voltage-to-time-to-voltage amplification. The operations 900 may be performed, for example, by a VTVA, such as the VTVA 200, 300, 500, 600, or 700.

At block 902, the VTVA sources or sinks, via a first current source (e.g., current source 210, current source 310-1, current source 810), a first current to or from a first input capacitive element (e.g., C1 or C1$_p$) during a first phase (e.g., $\phi_1$, $\phi_{1m}$, or $\phi_{1p}$). The first input capacitive element may be selectively coupled to a first input node (e.g., input node 330-1) of the VTVA. At block 904, the VTVA compares, via a first amplifier (e.g., amplifier 304-1), a voltage on the first input capacitive element to a threshold voltage (e.g., $V_{th}$).

At block 906, the VTVA sources or sinks, via the first current source (e.g., current source 310-1), a second current to or from a first output capacitive element (e.g., C2$_p$) during a second phase based on the comparison. The first output capacitive element may be coupled to a first output node (e.g., output node 332-1) of the VTVA, wherein the first phase is non-overlapping with the second phase.

In some aspects, the VTVA may sample (e.g., during sampling phase $\phi_s$) a first input voltage (e.g., $V_{ip}$) on the first input capacitive element prior to the first phase. The VTVA may also sample a reference voltage (e.g., $V_{ref}$ or zero volts as described with respect to FIG. 8) on the first output capacitive element prior to the first phase.

In some aspects, comparing the voltage on the first input capacitive element to the threshold voltage yields a comparison signal. The VTVA may apply a delay to the comparison signal via a delay element (e.g., of delay line 308-1). The second discharge current may be sourced or sunk based on the delayed comparison signal.

In some aspects, the VTVA may source or sink, via a second current source (e.g., current source 310-2), a third current to or from a second input capacitive element (e.g., capacitive element C1$_m$) during a third phase. The second input capacitive element may be coupled to a second input node (e.g., input node 330-2) of the VTVA. The first input node and the second input node may form a differential input for the VTVA. The VTVA may compare, via a second amplifier (e.g., amplifier 304-2), a voltage on the second input capacitive element to the threshold voltage. The VTVA may source or sink, via the second current source, a fourth current from a second output capacitive element (e.g., C2$_m$) during a fourth phase based on the comparison. The first output capacitive element may be coupled to a second output node (e.g., output node 332-2) of the VTVA, the third phase being non-overlapping with the fourth phase. In some implementations, the third phase may be the same as the first phase (e.g., phase $\phi_1$).

In some aspects, comparing the voltage on the first input capacitive element to the threshold voltage yields a first comparison signal, and comparing the voltage on the second input capacitive element to the threshold voltage yields a second comparison signal. The VTVA may delay the first comparison signal via a first delay line (e.g., delay line 308-1), the second discharge current being source or sunk based on the delayed first comparison signal. The VTVA may delay the second comparison signal via a second delay line (e.g., delay line 308-2), the fourth discharge current being sourced or sunk based on the delayed second comparison signal.

In some aspects, comparing the voltage on the first input capacitive element to the threshold voltage yields a first comparison signal, and comparing the voltage on the second input capacitive element to the threshold voltage yields a second comparison signal. The VTVA may delay the first comparison signal via at least one first delay element (e.g., delay cell 690 shown in FIG. 6) of a first delay line (e.g., delay line 308-1) and delay the second comparison signal via at least one second delay element (e.g., delay cell 692 shown in FIG. 6) of a second delay line (e.g., delay line 308-2). The VTVA may sample a reference voltage (e.g., $V_{ref}$) on the first output capacitive element and the second output capacitive element based on the delayed first comparison signal and the delayed second comparison signal.

In some aspects, the VTVA may end the first phase based on the voltage on the first input capacitive element reaching the threshold voltage and end the third phase based on the voltage on the second input capacitive element reaching the threshold voltage. The VTVA may start the second phase based on the first phase ending and start the fourth phase based on the third phase ending. The VTVA may end the second phase and the fourth phase after the voltages on the first input capacitive element and the second input capacitive element reach the threshold voltage.

Example Aspects

Aspect 1: A voltage-to-time-to-voltage amplifier (VTVA), comprising: a first input node; a first input capacitive element selectively coupled to the first input node; a first amplifier having an input coupled to the first input capacitive element; a first current source configured to source or sink a first current to or from the first input capacitive element during a first phase through a first switch; and a first output node; a first output capacitive element coupled to the first output node, wherein: the first current source is further configured to source or sink a second current to or from the first output capacitive element during a second phase through a second switch, the second switch comprising a control input coupled to an output of the first amplifier; and the first phase is non-overlapping with the second phase.

Aspect 2: The VTVA of Aspect 1, further comprising: a third switch coupled between the first input capacitive element and the first input node; and a fourth switch coupled between the first output capacitive element and a reference voltage node.

Aspect 3: The VTVA of Aspect 2, wherein the third switch and the fourth switch are closed during a sampling phase prior to the first phase.

Aspect 4: The VTVA according to any of Aspects 1-3, wherein: the first switch is coupled between the first current source and the first input capacitive element, the first switch being closed during the first phase; and the second switch is coupled between the first current source and the first output capacitive element, the second switch being closed during the second phase.

Aspect 5: The VTVA according to any of Aspects 1-4, further comprising a delay element coupled between an output of the first amplifier and the control input of the second switch.

Aspect 6: The VTVA according to any of Aspects 1-5, further comprising: a second input capacitive element selectively coupled to a second input node of the VTVA, the first input node and the second input node forming a differential input for the VTVA; a second amplifier having an input coupled to the second input capacitive element; a second current source configured to source or sink a third current to or from the second input capacitive element during a third phase through a third switch; and a second output capacitive element coupled to a second output node of the VTVA, wherein: the first current source is further configured to source or sink a fourth current from the first output capacitive element during a fourth phase through a fourth switch, a control input of the fourth switch being coupled to the second amplifier; and the third phase is non-overlapping with the fourth phase.

Aspect 7: The VTVA of Aspect 6, wherein the third phase is the same as the first phase.

Aspect 8: The VTVA of Aspect 6 or 7, wherein: the first switch is coupled between the first current source and the first input capacitive element, the first switch being closed during the first phase; the second switch is coupled between the first current source and the first output capacitive element, the second switch being closed during the second phase; the third switch is coupled between the second current source and the second input capacitive element, the third switch being closed during the third phase; and the fourth switch is coupled between the second current source and the second output capacitive element, the fourth switch being closed during the fourth phase.

Aspect 9: The VTVA according to any of Aspects 6-8, further comprising: a first delay line coupled between the output of the first amplifier and the control input of the second switch; and a second delay line coupled between the output of the second amplifier and the control input of the fourth switch.

Aspect 10: The VTVA of Aspect 9, further comprising: a fifth switch coupled between the first input capacitive element and the first input node; a sixth switch coupled between the first output capacitive element and a reference voltage node; and logic comprising a first input coupled to a delay element of the first delay line, a second input coupled to a delay element of the second delay line, and an output coupled to a control input of the sixth switch.

Aspect 11: The VTVA of Aspect 10, wherein the logic comprises: an AND gate, the first input of the logic being a first input of the AND gate and the second input of the logic being a second input of the AND gate; and an OR gate comprising a first input coupled to an output of the AND gate and a second input configured to receive a sampling phase signal used to control the fifth switch, the output of the logic being an output of the OR gate.

Aspect 12: The VTVA according to any of Aspects 8-11, further comprising logic comprising inputs coupled to the output of the first amplifier and the output of the second amplifier, and an output coupled to control inputs of the first switch, second switch, the third switch, and the fourth switch.

Aspect 13: The VTVA according to any of Aspects 8-12, further comprising: a first AND gate comprising a first input configured to receive a first phase signal that is logic high between sampling phases of the VTVA, a second input coupled to the output of the first amplifier, and an output coupled to a control input of the first switch; and a second AND gate comprising a first input configured to receive the first phase signal, and a second input coupled to the output of the second amplifier, and output coupled to a control input of the third switch.

Aspect 14: The VTVA according to any of Aspects 8-13, further comprising: an OR gate comprising a first input coupled to the output of the first amplifier and a second input coupled to the output of the second amplifier; a first AND gate comprising a first input coupled to an output of the OR gate, a second input configured to receive an inverse of an output signal of the first amplifier; and an output coupled to the control input of the second switch; and a second AND gate comprising a first input coupled to the output of the OR gate, a second input configured to receive an inverse of an output signal of the second amplifier; and an output coupled to the control input of the fourth switch.

Aspect 15: The VTVA according to any of Aspects 6-14, further comprising: a first alternating current (AC)-coupling capacitive element coupled between a reference voltage node and the first input capacitive element; and a second AC-coupling capacitive element coupled between the reference voltage node and the second input capacitive element.

Aspect 16: The VTVA of Aspect 15, further comprising: a fifth switch coupled between the reference voltage node and the first AC-coupling capacitive element; and a sixth switch coupled between the reference voltage node and the second AC-coupling capacitive element.

Aspect 17: The VTVA of Aspect 15 or 16, further comprising a third switch coupled between the reference voltage node and a node between the first AC-coupling capacitive element and the second AC-coupling capacitive element, the node being further coupled to the first switch and the third switch.

Aspect 18: A method for voltage-to-time-to-voltage amplification, comprising: sourcing or sinking, via a first current source, a first current to or from a first input capacitive element during a first phase, the first input capacitive element being selectively coupled to a first input node of a voltage-to-time-to-voltage amplifier (VTVA); comparing, via a first amplifier, a voltage on the first input capacitive element to a threshold voltage; and sourcing or sinking, via the first current source, a second current to or from a first output capacitive element during a second phase based on the comparison, the first output capacitive element being coupled to a first output node of the VTVA, wherein the first phase is non-overlapping with the second phase.

Aspect 19: The method of Aspect 18, further comprising: sampling a first input voltage on the first input capacitive element prior to the first phase; and sampling a reference voltage on the first output capacitive element prior to the first phase.

Aspect 20: The method of Aspect 18 or 19, wherein: comparing the voltage on the first input capacitive element to the threshold voltage yields a comparison signal; the method further comprises applying a delay to the comparison signal via a delay element; and the second current is sourced or sunk based on the delayed comparison signal.

Aspect 21: The method according to any of Aspects 18-20, further comprising: sourcing or sinking, via a second current source, a third current to or from a second input capacitive element during a third phase, wherein the second input capacitive element is coupled to a second input node of the VTVA, the first input node and the second input node forming a differential input for the VTVA; comparing, via a second amplifier, a voltage on the second input capacitive element to the threshold voltage; and sourcing or sinking, via the second current source, a fourth current to or from a second output capacitive element during a fourth phase based on the comparison, wherein the first output capacitive element is coupled to a second output node of the VTVA, the third phase being non-overlapping with the fourth phase.

Aspect 22: The method of Aspect 21, wherein the third phase is the same as the first phase.

Aspect 23: The method of Aspect 21 or 22, wherein: comparing the voltage on the first input capacitive element to the threshold voltage yields a first comparison signal; comparing the voltage on the second input capacitive element to the threshold voltage yields a second comparison signal; and the method further comprising: delaying the first comparison signal via a first delay line, the second current being sunk based on the delayed first comparison signal; and delaying the second comparison signal via a second delay line, the fourth current being sourced or sunk based on the delayed second comparison signal.

Aspect 24: The method according to any of Aspects 21-23, wherein: comparing the voltage on the first input capacitive element to the threshold voltage yields a first comparison signal; comparing the voltage on the second input capacitive element to the threshold voltage yields a second comparison signal; and the method further comprising: delaying the first comparison signal via at least one first delay element of a first delay line; delaying the second comparison signal via at least one second delay element of a second delay line; and sampling a reference voltage on the first output capacitive element and the second output capacitive element based on the delayed first comparison signal and the delayed second comparison signal.

Aspect 25: The method according to any of Aspects 21-24, further comprising: ending the first phase based on the voltage on the first input capacitive element reaching the threshold voltage; and ending the third phase based on the voltage on the second input capacitive element reaching the threshold voltage.

Aspect 26: The method of Aspect 25, further comprising: starting the second phase based on the first phase ending; starting the fourth phase based on the third phase ending; and ending the second phase and the fourth phase after the voltages on the first input capacitive element and the second input capacitive element reach the threshold voltage.

Aspect 27: A voltage-to-time-to-voltage amplifier (VTVA), comprising: a first input node; a first input capacitive element selectively coupled to the first input node; a first amplifier having an input coupled to the first input capacitive element; a first current source; a first switch coupled between the first current source and the first input capacitive element; a first output node; a first output capacitive element coupled to the first output node; and a second switch coupled between the first current source and the first output capacitive element, a control input of the second switch being coupled to an output of the first amplifier.

Aspect 28: The VTVA of Aspect 27, further comprising: a third switch coupled between the first input capacitive element and the first input node; and a fourth switch between the first output capacitive element and a reference voltage node.

Aspect 29: The VTVA of Aspect 27 or 28, further comprising a delay element coupled between an output of the first amplifier and the control input of the second switch.

Aspect 30: The VTVA according to any of Aspects 27-29, further comprising: a second input capacitive element selectively coupled to a second input node of the VTVA, the first input node and the second input node forming a differential input for the VTVA; a second amplifier having an input coupled to the second input capacitive element; a second current source; a third switch coupled between the second current source and the second input capacitive element; a second output capacitive element coupled to a first output node of the VTVA; and a fourth switch coupled between the second current source and the second output capacitive element, a control input of the fourth switch being coupled to an output the second amplifier.

Aspect 31: The VTVA of Aspect 30, further comprising: a first delay line coupled between the output of the first amplifier and the control input of the second switch; and a second delay line coupled between the output of the second amplifier and the control input of the fourth switch.

Aspect 32: The VTVA of Aspect 31, further comprising: a fifth switch coupled between the first input capacitive element and the first input node; a sixth switch coupled between the first output capacitive element and a reference voltage node; and logic comprising a first input coupled to a delay element of the first delay line, a second input coupled to a delay element of the second delay line, and an output coupled to a control input of the sixth switch.

Aspect 33: The VTVA of Aspect 32, wherein the logic comprises: an AND gate, the first input of the logic being a first input of the AND gate and the second input of the logic being a second input of the AND gate; and an OR gate comprising a first input coupled to an output of the AND gate and a second input configured to receive a sampling phase signal used to control the fifth switch, wherein the output of the logic is the output of the OR gate.

Aspect 34: The VTVA according to any of Aspects 30-33, further comprising logic comprising inputs coupled to the output of the first amplifier and the output of the second amplifier, and an output coupled to control inputs of the first switch, second switch, the third switch, and the fourth switch.

Aspect 35: The VTVA according to any of Aspects 30-34, further comprising: a first AND gate comprising a first input configured to receive a first phase signal that is logic high between sampling phases of the VTVA, a second input coupled to an output of the first amplifier, and an output coupled to a control input of the first switch; and a second AND gate comprising a first input configured to receive the first phase signal, a second input coupled to an output of the second amplifier, and an output coupled to a control input of the third switch.

Aspect 36: The VTVA according to any of Aspects 30-35, further comprising: an OR gate comprising a first input coupled to the output of the first amplifier and a second input coupled to the output of the second amplifier; a first AND gate comprising a first input coupled to an output of the OR gate, a second input configured to receive an inverse of an output signal of the first amplifier, and an output coupled to a control input of the second switch; and a second AND gate comprising a first input coupled to the output of the OR gate, a second input configured to receive an inverse of an output signal of the second amplifier, and an output coupled to a control input of the fourth switch.

Aspect 37: The VTVA according to any of Aspects 30-36, further comprising: a first alternating current (AC)-coupling capacitive element selectively coupled between a reference voltage node and the first input capacitive element; and a second AC-coupling capacitive element selectively coupled between the reference voltage node and the second AC-coupling capacitive element.

Aspect 38: The VTVA of Aspect 37, further comprising: a fifth switch coupled between the reference voltage node and the first AC-coupling capacitive element; and a sixth switch coupled between the reference voltage node and the second AC-coupling capacitive element.

Aspect 39: The VTVA of Aspect 37 or 38, further comprising a third switch coupled between the reference voltage node and a node between the first input capacitive element and the second input capacitive element, the node being further coupled to the first switch and the third switch.

Aspect 40: A differential voltage-to-time-to-voltage amplifier (VTVA), comprising: a first input capacitive element and a second input capacitive element selectively coupled to differential input nodes of the VTVA, respectively; a first amplifier and a second amplifier having inputs coupled to the first input capacitive element and the second input capacitive element, respectively; a first current source selectively coupled to the first input capacitive element via a first switch; a second current source selectively coupled to the second input capacitive element via a second switch; a first alternating-current (AC)-coupling capacitive element coupled between the first switch and the first input capacitive element; and a second AC-coupling capacitive element coupled between the second switch and the second input capacitive element.

Aspect 41: The differential VTVA of Aspect 40, further comprising: a third switch coupled between a reference voltage node and the first AC-coupling capacitive element; and a fourth switch coupled between the reference voltage node and the second AC-coupling capacitive element.

Aspect 42: The differential VTVA of Aspect 40 or 41, further comprising a third switch coupled between a reference voltage node and a node between the first input capacitive element and the second input capacitive element, the node being further coupled to the first switch and the second switch.

Additional Considerations

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. A voltage-to-time-to-voltage amplifier (VTVA), comprising:
- a first input node;
- a first input capacitive element selectively coupled to the first input node;
- a first amplifier having an input coupled to the first input capacitive element;
- a first current source configured to source or sink a first current to or from the first input capacitive element during a first phase through a first switch; and
- a first output node;
- a first output capacitive element coupled to the first output node, wherein:
  - the first current source is further configured to source or sink a second current to or from the first output capacitive element during a second phase through a second switch, the second switch comprising a control input coupled to an output of the first amplifier; and
  - the first phase is non-overlapping with the second phase.

2. The VTVA of claim 1, further comprising:
- a third switch coupled between the first input capacitive element and the first input node; and
- a fourth switch coupled between the first output capacitive element and a reference voltage node.

3. The VTVA of claim 1, wherein:
- the first switch is coupled between the first current source and the first input capacitive element, the first switch being closed during the first phase; and
- the second switch is coupled between the first current source and the first output capacitive element, the second switch being closed during the second phase.

4. The VTVA of claim 1, further comprising:
- a second input capacitive element selectively coupled to a second input node of the VTVA, the first input node and the second input node forming a differential input for the VTVA;
- a second amplifier having an input coupled to the second input capacitive element;
- a second current source configured to source or sink a third current to or from the second input capacitive element during a third phase through a third switch; and
- a second output capacitive element coupled to a second output node of the VTVA, wherein:
  - the second current source is further configured to source or sink a fourth current to or from the second output capacitive element during a fourth phase through a fourth switch, a control input of the fourth switch being coupled to the second amplifier; and
  - the third phase is non-overlapping with the fourth phase.

5. The VTVA of claim 4, wherein:
- the first switch is coupled between the first current source and the first input capacitive element, the first switch being closed during the first phase;

the second switch is coupled between the first current source and the first output capacitive element, the second switch being closed during the second phase;

the third switch is coupled between the second current source and the second input capacitive element, the third switch being closed during the third phase; and the fourth switch is coupled between the second current source and the second output capacitive element, the fourth switch being closed during the fourth phase.

6. The VTVA of claim 4, further comprising:

a first delay line coupled between the output of the first amplifier and the control input of the second switch; and a second delay line coupled between the output of the second amplifier and the control input of the fourth switch.

7. The VTVA of claim 6, further comprising:

a fifth switch coupled between the first input capacitive element and the first input node;

a sixth switch coupled between the first output capacitive element and a reference voltage node; and logic comprising a first input coupled to a delay element of the first delay line, a second input coupled to a delay element of the second delay line, and an output coupled to a control input of the sixth switch.

8. The VTVA of claim 5, further comprising logic comprising inputs coupled to the output of the first amplifier and the output of the second amplifier, and an output coupled to control inputs of the first switch, the second switch, the third switch, and the fourth switch.

9. The VTVA of claim 4, further comprising:

a first alternating current (AC)-coupling capacitive element coupled between a reference voltage node and the first input capacitive element; and a second AC-coupling capacitive element coupled between the reference voltage node and the second input capacitive element.

10. A method for voltage-to-time-to-voltage amplification, comprising:

sourcing or sinking, via a first current source, a first current to or from a first input capacitive element during a first phase, the first input capacitive element being selectively coupled to a first input node of a voltage-to-time-to-voltage amplifier (VTVA);

comparing, via a first amplifier, a voltage on the first input capacitive element to a threshold voltage; and sourcing or sinking, via the first current source, a second current to or from a first output capacitive element during a second phase based on the comparison, the first output capacitive element being coupled to a first output node of the VTVA, wherein the first phase is non-overlapping with the second phase.

11. The method of claim 10, further comprising:

sampling a first input voltage on the first input capacitive element prior to the first phase; and sampling a reference voltage on the first output capacitive element prior to the first phase.

12. The method of claim 10, wherein:

comparing the voltage on the first input capacitive element to the threshold voltage yields a comparison signal;

the method further comprises applying a delay to the comparison signal via a delay element; and the second current is sourced or sunk based on the delayed comparison signal.

13. The method of claim 10, further comprising:

sourcing or sinking, via a second current source, a third current to or from a second input capacitive element during a third phase, wherein the second input capacitive element is coupled to a second input node of the VTVA, the first input node and the second input node forming a differential input for the VTVA;

comparing, via a second amplifier, a voltage on the second input capacitive element to the threshold voltage; and sourcing or sinking, via the second current source, a fourth current to or from a second output capacitive element during a fourth phase based on the comparison, wherein the second output capacitive element is coupled to a second output node of the VTVA, the third phase being non-overlapping with the fourth phase.

14. The method of claim 13, wherein:

comparing the voltage on the first input capacitive element to the threshold voltage yields a first comparison signal;

comparing the voltage on the second input capacitive element to the threshold voltage yields a second comparison signal; and the method further comprising:

delaying the first comparison signal via a first delay line, the second current being sunk based on the delayed first comparison signal; and delaying the second comparison signal via a second delay line, the fourth current being sourced or sunk based on the delayed second comparison signal.

15. The method of claim 13, wherein:

comparing the voltage on the first input capacitive element to the threshold voltage yields a first comparison signal;

comparing the voltage on the second input capacitive element to the threshold voltage yields a second comparison signal; and the method further comprising:

delaying the first comparison signal via at least one first delay element of a first delay line;

delaying the second comparison signal via at least one second delay element of a second delay line; and sampling a reference voltage on the first output capacitive element and the second output capacitive element based on the delayed first comparison signal and the delayed second comparison signal.

16. The method of claim 13, further comprising:

ending the first phase based on the voltage on the first input capacitive element reaching the threshold voltage; and ending the third phase based on the voltage on the second input capacitive element reaching the threshold voltage.

17. The method of claim 16, further comprising:

starting the second phase based on the first phase ending;

starting the fourth phase based on the third phase ending; and ending the second phase and the fourth phase after the voltages on the first input capacitive element and the second input capacitive element reach the threshold voltage.

18. A voltage-to-time-to-voltage amplifier (VTVA), comprising:

a first input node;

a first input capacitive element selectively coupled to the first input node;

a first amplifier having an input coupled to the first input capacitive element;

a first current source;

a first switch coupled between the first current source and the first input capacitive element;

a first output node;

a first output capacitive element coupled to the first output node; and a second switch coupled between the first current source and the first output capacitive element, a control input of the second switch being coupled to an output of the first amplifier.

19. The VTVA of claim 18, further comprising:

a third switch coupled between the first input capacitive element and the first input node; and a fourth switch between the first output capacitive element and a reference voltage node.

20. The VTVA of claim 18, further comprising a delay element coupled between an output of the first amplifier and the control input of the second switch.

21. The VTVA of claim 18, further comprising:

a second input capacitive element selectively coupled to a second input node of the VTVA, the first input node and the second input node forming a differential input for the VTVA;

a second amplifier having an input coupled to the second input capacitive element;

a second current source;

a third switch coupled between the second current source and the second input capacitive element;

a second output capacitive element coupled to a first output node of the VTVA; and a fourth switch coupled between the second current source and the second output capacitive element, a control input of the fourth switch being coupled to an output the second amplifier.

22. The VTVA of claim 21, further comprising:

a first delay line coupled between the output of the first amplifier and the control input of the second switch; and a second delay line coupled between the output of the second amplifier and the control input of the fourth switch.

23. The VTVA of claim 22, further comprising:

a fifth switch coupled between the first input capacitive element and the first input node;

a sixth switch coupled between the first output capacitive element and a reference voltage node; and logic comprising a first input coupled to a delay element of the first delay line, a second input coupled to a delay element of the second delay line, and an output coupled to a control input of the sixth switch.

24. The VTVA of claim 21, further comprising logic comprising inputs coupled to the output of the first amplifier and the output of the second amplifier, and an output coupled to control inputs of the first switch, second switch, the third switch, and the fourth switch.

* * * * *